(12) United States Patent
Martin et al.

(10) Patent No.: US 8,420,930 B2
(45) Date of Patent: Apr. 16, 2013

(54) METHOD FOR MAKING A PROTECTIVE ELEMENT FOR ITEMS AND CASING OBTAINED BY SAID METHOD

(75) Inventors: Arnaud Martin, La Ville Aux Dames (FR); Frédéric Chatelain, Tours (FR)

(73) Assignee: Faiveley Transport Tours, Saint-Pierre des Corps (FR)

( * ) Notice: Subject to any disclaimer, the term of this patent is extended or adjusted under 35 U.S.C. 154(b) by 351 days.

(21) Appl. No.: 12/811,796

(22) PCT Filed: Jan. 8, 2009

(86) PCT No.: PCT/FR2009/000020
§ 371 (c)(1),
(2), (4) Date: Nov. 16, 2010

(87) PCT Pub. No.: WO2009/106761
PCT Pub. Date: Sep. 3, 2009

(65) Prior Publication Data
US 2011/0056962 A1     Mar. 10, 2011

(30) Foreign Application Priority Data

Jan. 8, 2008  (FR) ...................................... 08 50091

(51) Int. Cl.
*H05K 5/00* (2006.01)
(52) U.S. Cl.
USPC ............ 174/50; 174/17 R; 174/544; 206/521; 312/223.1; 312/409
(58) Field of Classification Search .................... 174/50, 174/17 R, 17.08, 520, 521, 539, 559, 564, 174/50.51, 535, 544, 377, 546; 361/600, 361/601, 641, 658, 724, 730, 752, 796; 312/223.1, 312/223.2, 223.6, 409; 206/521; 29/592, 29/592.1
See application file for complete search history.

(56) References Cited

U.S. PATENT DOCUMENTS

| 3,383,565 A | 5/1968 | Gritton |
| 4,272,137 A | 6/1981 | Rothhaas et al. |

(Continued)

FOREIGN PATENT DOCUMENTS

| FR | 1.509.757 | 1/1968 |
| FR | 2 423 618 | 11/1979 |

(Continued)

*Primary Examiner* — Angel R Estrada
(74) *Attorney, Agent, or Firm* — Harness, Dickey & Pierce, P.L.C.

(57) ABSTRACT

The purpose of the disclosure is to provide an insulation structure for efficiently controlling a thermal flow and protecting objects that is easy to implement, has a low cost and is compliant with strict standards in terms of fire resistance while offering protection against crushing and immersion. Accordingly the disclosure relates to a method for protecting at least one object previously encapsulated in a sealed pocket, that comprises imbedding the objects without trapping any air in a body of a high thermal-resistance insulator containing gypsum crystals, said insulator body being cast in a structure having a high mechanical resistance to crushing, and said structure consisting of an intermediate mould or directly defining a housing. A casing obtained by said method comprises the body block of a high thermal-resistance insulator and the housing having a high mechanical resistance to crushing. Advantageously, the objects, such as an electronic board, are encapsulated in a silicone sealed pocket, and the housing includes steam discharge slots as well as an opening for casting the insulator body, said opening being then closed by a plate held on the housing by screws. Sealed ducts are provided in the plate, the insulator, and the pocket for passing electric wires therethrough.

16 Claims, 3 Drawing Sheets

U.S. PATENT DOCUMENTS

| | | | | |
|---|---|---|---|---|
| 4,944,401 A | * | 7/1990 | Groenewegen | 174/544 |
| 5,123,538 A | * | 6/1992 | Groenewegen | 174/546 |
| 6,158,833 A | * | 12/2000 | Engler | 312/409 |
| 7,208,685 B2 | * | 4/2007 | Browning et al. | 174/544 |
| 7,880,097 B2 | * | 2/2011 | Moore et al. | 174/539 |
| 7,916,487 B2 | * | 3/2011 | Bitton et al. | 174/50 |
| 8,121,752 B2 | * | 2/2012 | Winterhalter et al. | 174/544 |
| 2006/0272838 A1 | | 12/2006 | Sauerzweig | |

FOREIGN PATENT DOCUMENTS

| | | |
|---|---|---|
| FR | 2 753 044 | 3/1998 |
| WO | WO 2005/025285 | 3/2005 |

\* cited by examiner

METHOD FOR MAKING A PROTECTIVE ELEMENT FOR ITEMS AND CASING OBTAINED BY SAID METHOD

CROSS-REFERENCE TO RELATED APPLICATIONS

This application is a National Phase Entry of International Application No. PCT/FR2009/000020, filed on Jan. 8, 2009, which claims priority to French Application 0850091, filed on Jan. 8, 2008, both of which are incorporated by reference herein.

BACKGROUND AND SUMMARY

The invention relates to a method of producing protection for objects against severe environmental conditions and a casing produced according to the method, in particular a data-recording black box for analysing causes of a vehicle accident, or a box for the long-term storage of precious objects.

The present invention concerns the field of thermal insulation by means of a material based on natural or synthetic gypsum, commonly referred to as plaster. This material, of chemical formula $CaSO_4,2H_2O$, is normally used in building work. It has, among other qualities, the ability to produce thermal insulation through the endothermic reactions in which it participates. It contains in fact approximately 20% water in crystalline form and up to 8% residual free water. When it is heated, gypsum gives rise to a first endothermic reaction of at least 454 kJ/kg at 1 bar between 100° and 120° C. (vaporisation of 1.5 molecules of water to which residual free water is added in variable proportions) and then a second endothermic reaction of 168 kJ/kg at 1 bar between 200° and 220° C. (vaporisation of 0.5 molecules of water).

Thus, the use of this material as thermal insulation results from the high quantity of heat absorbed during endothermic reactions, the most energetic (the first) occurring at a relatively low temperature (100°-120° C.). In addition, it releases neither gas nor vapour of a toxic character but only water. Plaster is therefore particularly indicated for thermally insulating objects.

A first known method for obtaining thermal insulation consists of filling the space delimited between two walls and more particularly between two interlinked volumes, with one or more thermally insulating materials. Thus, in the document FR 2423618, a fire-resistant cubicle comprising a plaster lining is described. This lining is provided between an external cladding and an internal cladding and is disposed so that unacceptable temperatures are not established in the cavity delimited by the internal cladding in the event of fire. However, this solution has the drawback of requiring two walls, internal and external, in order to hold the plaster-based insulation. In addition, this method does not protect the objects against mechanical attacks such as crushing nor combat external immersion.

Moreover, another known means for obtaining thermal insulation consists of covering the object to be protected with a material based on plaster. Such a method is used in the building field for protecting steel girders. However, this method requires the use of a specific plaster for the purpose of obtaining good mechanical strength of the material in the event of fire and thus preventing its cracking or becoming detached from the support to be protected. In addition, this method offers neither mechanical protection against crushing nor impermeability on immersion in fluids.

Consequently it is useful to seek an insulating structure for effectively controlling a heat flux and protecting objects, simple through its method of production, at less cost, and that can comply with strict fire-resistance standards, while being capable of offering protection against crushing and impermeability on immersion in fluids. The present invention aims to satisfy at least one of these objectives by means of a rigid envelope surrounding the object to be protected covered with plaster.

More precisely, the subject matter of the invention is a method of protecting at least one object, consisting of embedding the object or objects, without trapping air, in an insulating mass with high thermal resistance based on gypsum crystals, of known total formula $CaSO_4,2H_2O$, this insulating mass being cast in a structure with high mechanical crushing resistance. This structure is not totally airtight and discharges gases, in particular steam, when exposed to high temperatures. Protection of objects against immersion is therefore achieved in advance, by sealed encapsulation of the object or objects.

Advantageously, the method according to the invention complies with the standards for fire resistance and resistance of temperatures of up to approximately 1100° C. Advantageously, the thermal protection method consists of weighting the composition of the insulation by means of a distribution between a quantity of crystals of hydrated calcium sulphate of type α and a quantity of crystals of hydrated calcium sulphate of type β, according to the thickness of insulation required and the maximum temperature that may be withstood by the objects to be protected.

Hemi-hydrated calcium sulphate is at the basis of various plasters, in particular plasters of type α and β, which differ through their mechanical and thermal properties. Plaster of type α is dense and has high mechanical strength, unlike plaster of type β, lighter and more fragile. The high density of α plaster makes it possible to store more water in the crystalline state and thus offers better thermal protection for equal volume or thickness.

According to particular features, the insulation with high thermal resistance is formed mainly on the basis of crystals of calcium sulphate of type α and incorporates binders and/or additives, as well as an inert mineral filler. The latter elements may facilitate mixing and modify the setting time of the plaster. The mixing ratio, that is to say the proportion of water added, is adjusted according to the nature of the plaster and its adjuvants in order to completely hydrate the plaster while leaving a minimum amount of excess water. A low granulosity will favour its hydration. Thus, the plaster, once dry, has a low porosity and the quantity of water in crystalline form is maximum for a given volume.

According to a particular embodiment, the method consists in filling, with an insulating slip with high thermal resistance, an enclosure serving as a structure with high mechanical strength in which the objects to be protected, previously introduced into the enclosure through an orifice (3), are placed, and then closing off the filling orifice of the enclosure once the slip has solidified. Alternatively, a temporary mould serves as a structure, the temporary mould being removed after solidification of the slip into an insulating block with high thermal resistance, and the enclosure formed from at least two parts being disposed in place of the mould in order to adopt the shape of the block of insulation. Advantageously, the objects are placed at the centre of the insulation with high thermal resistance, so that the thermal protection of the objects is isotropic.

The invention also concerns a casing produced in accordance with the method. Such a casing comprises a block of insulation with high thermal resistance based on gypsum crystals, which may mainly be composed of crystals of hydrated calcium sulphate of type α, and an enclosure with high mechanical resistance to crushing that adopts the external shape of the block of thermal insulation and a silicone-based fluid tight pouch encapsulating the objects to be protected, the pouch being disposed substantially isotropically within the insulation with high thermal resistance. This fluid tight pouch preserves them from immersion in any fluid, in particular water.

According to particular embodiments:

the casing is conformed according to the dimensions of a data-recorder black box, in which the objects to be protected may be storage memories and the interface components thereof installed on an electronic card. In particular a signal converter;

the material of the enclosure is chosen from a material based on metal, a metal alloy, Kevlar and carbon fibres;

the enclosure comprises at least one steam discharge opening, in particular at least one slot, the water molecules being released in the crystalline state from the insulation with high thermal resistance when the latter is subjected to high temperatures;

the external enclosure and the pouch are provided with at least one sealed conduit for electric wires to pass, allowing electrical supply and access to the memories of the electronic card contained in the sealed pouch;

the casing is conformed according to the dimensions of a box for the long-term storage of precious objects to be protected, protected from mechanical stresses, fire and high temperatures.

Other features and advantages of the invention will emerge from the following reading of a detailed example embodiment of a railway recording black box complying with the requirements of thermal resistance, mechanical strength and immersion of IEEE 1482.1, with reference to the figures.

DETAILED DESCRIPTION

Figure 1:
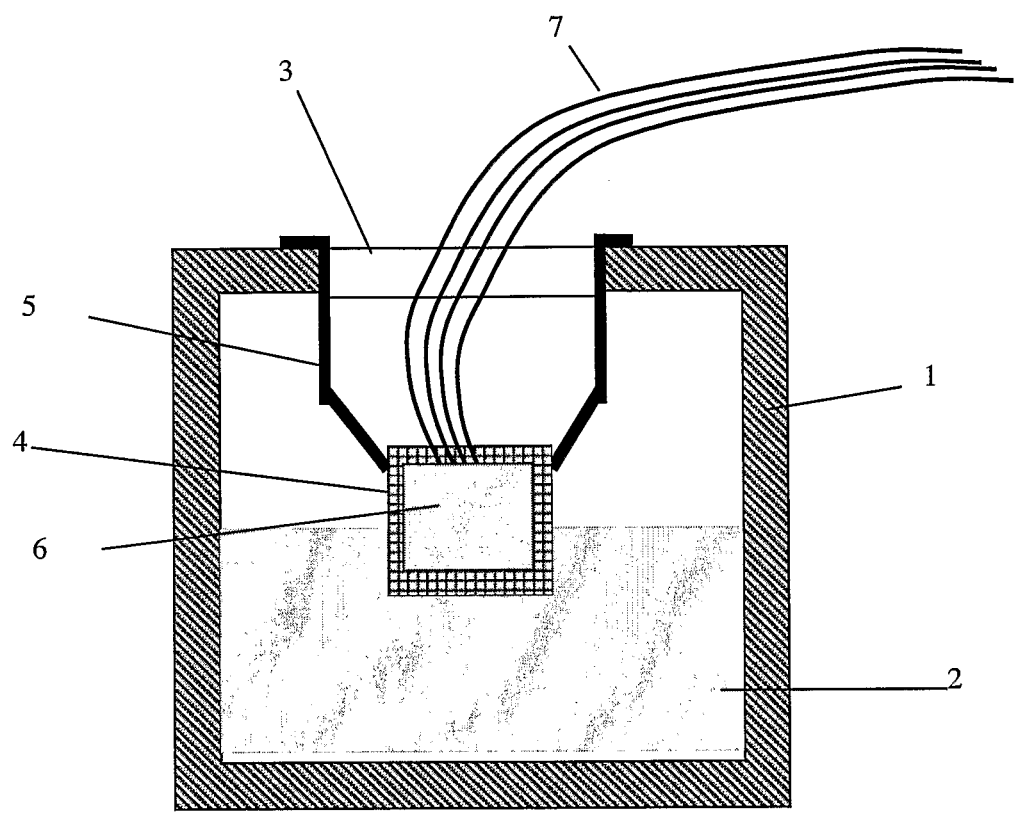
FIG. 1 shows an example of implementation of the manufacturing method according to the invention comprising a prior encapsulation of an electronic card to be protected.

FIG. 1 illustrates an example of implementation of the method of the invention for manufacturing a black box from an external metal enclosure 1, the role of which is to offer mechanical protection. This enclosure is provided with an orifice 3 through which a sealed pouch 4 is introduced, in which the electronic card 6 to be protected thermally is encapsulated. The electrical wires 7 of the electronic card emerge through this orifice 3. Advantageously, a positioning device, such as a clamp 5, holds the pouch 4 at the centre of the mould so that the thickness of insulation is uniform around it and consequently the thermal protection is isotropic.

The calcium sulphate-based insulation based 2 is poured in the form of a slip between the pouch 4 and the enclosure 1 until it is filled, in order to fill in the air void initially contained in the enclosure 1 and cover the pouch 4 thus immersed in the slip without trapping any air. Preferably, this moulding step takes place in two stages. In a first stage, the enclosure is filled up to the level of the holding device 5. In a second stage, when the insulation has solidified, the holding device 5 is removed and then the enclosure is completed by the insulation 2 in slip form.

Once the insulation 2 has solidified inside the enclosure 1, the orifice is filled in by the addition of a plate fixed to the enclosure 1 or a metal supplement included in the thickness of the enclosure, this plate or supplement being cut in order to allow only the passage of the electrical wires 7. A variant of the method described above consists of using a temporary mould instead of the metal enclosure 1 during the moulding operations. Once the insulation has solidified, the mould is removed and the metal enclosure formed for example by two half shells is added.

Figure 2:
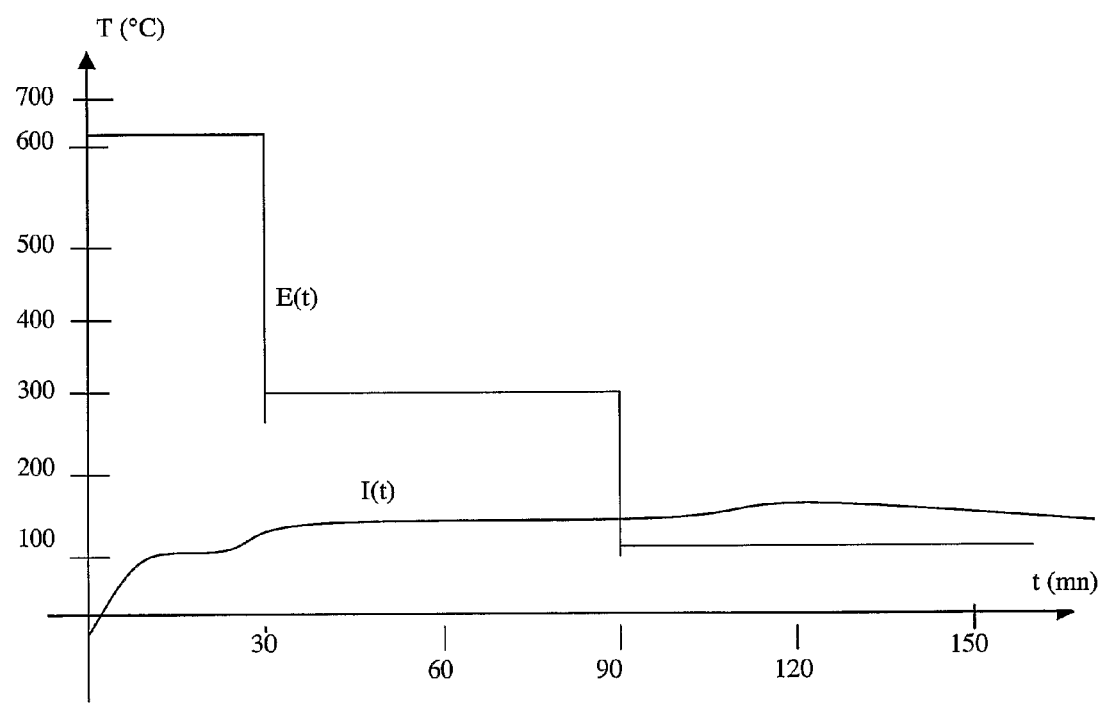
FIG. 2 shows the curves for thermal change of the insulation with high thermal resistance and of the electronic card protected in the black box obtained by the method according to the invention.

FIG. 2 shows the curve for thermal change E(t) of an insulation with high thermal resistance based on calcium sulphate hemi-hydrated crystals, used in the method described above. For better compactness of the black box, the insulation adopted was prepared from a plaster composed mainly of crystals of calcium sulphate hemi-hydrate of type α. FIG. 2 also illustrates the temperature curve I(t) for the electronic card thus protected. The black box thus produced was subjected to a thermal resistance test in accordance with IEEE 1482.1.

The temperature change curve E(t) gives the ambient temperature to which the black box is exposed. The curve I(t) gives the temperature recorded at the electronic card situated at the heart of the black box. This shows the maintenance of the electronic card at a reasonable temperature, which does not exceed temperatures of around 180° C.—whereas the ambient temperature E(t) has reached 650° C.—thus preserving the data recorded in memories of the flash type.

Figure 3:
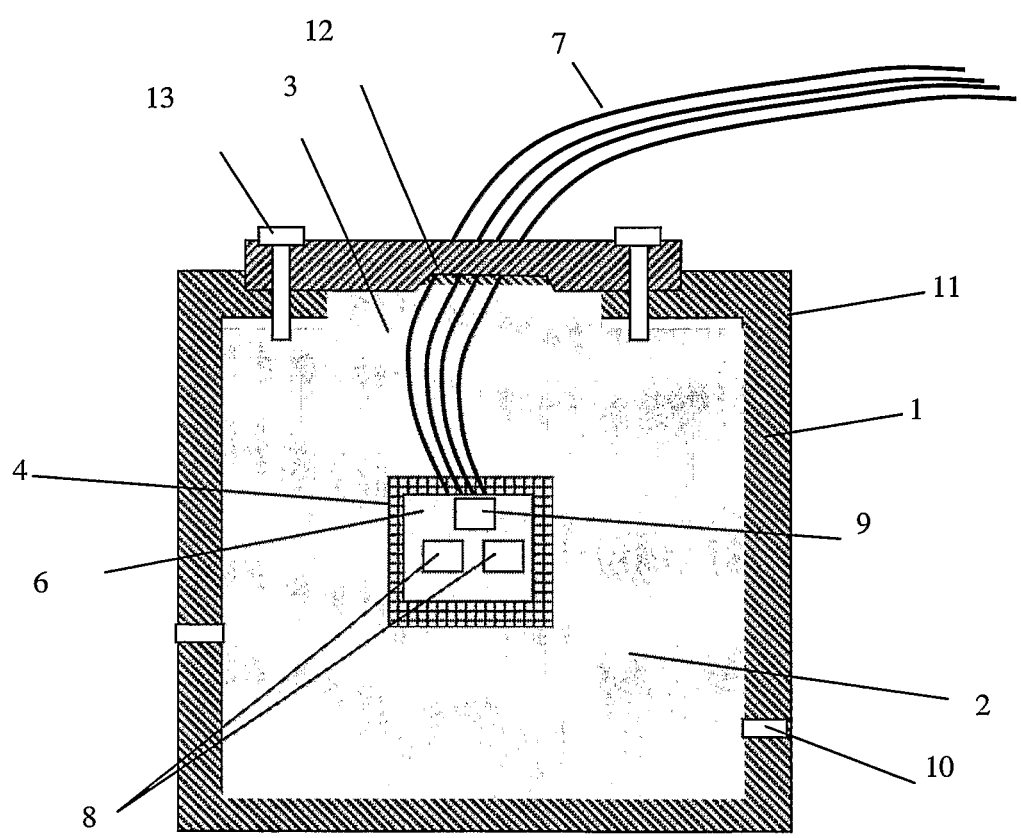
FIG. 3 shows a casing forming a black box produced according to the method.

In accordance with FIG. 3, a casing 11 of the black box type produced according to the method described above is placed at a secure location on the locomotive of a train. It is provided with an external metal enclosure 1, an insulating layer with high thermal resistance 2 cast between the enclosure 1 and the silicone pouch 4. The pouch 4 encapsulates data storage memories 8 on an electronic card 6 associated with a signal converter 9 to a data recorder placed outside the casing by means of electrical cables 7.

The black box 11 is provided with orifices 10 on each side of the external envelope 1, for discharging steam coming from the insulation 2, when this is subjected to high temperatures, and maintaining an acceptable pressure within the casing 1. Thus the temperature of the objects 8, 9 and 6 to be protected does not increase through this phenomenon. Moreover, the orifice 3 is closed by the addition of a metal plate 12 fixed by screws 13 to the enclosure 1. The metal plate 12 is prepared, for example by calibrated piercing of one or more sealed conduits, so as to allow the passage only of the electrical wires 7 between this plate and the enclosure 1, which in no way impairs the thermomechanical protection of the storage memories 8 and of the signal converter 9.

In this example, the external steel-based envelope 1 has a sufficient thickness (approximately 5 mm) to constitute mechanical protection. The external dimensions of the black box 11 are 17×8×11 cm$^3$. In other examples, this thickness may vary according to the mechanical strength standards applicable.

The silicone-based material of the pouch 4 advantageously ensures the sealing of the content of the pouch in the event of immersion of the black box 11 in water or with regard to the water evaporating from the insulation 2 during endothermic reaction phases. In addition, sealed openings (not shown) are provided in the pouch 4 for the passage of the electrical wires 7. Because of the above, the insulation 2 with high thermal resistance enables the elements 8, 9 and 6 that are to be protected, and more particularly the storage memory 8, not to exceed temperatures above 150° C. Moreover, the black box 11 can withstand external temperatures above 750° C., for example around 900° C. to 1000° C. or 1100° C. by increasing the dimensions thereof.

Alternatively, the protective casing forms a long-term storage enclosure for preserving from fire, mechanical stresses and severe temperatures the integrity of objects precious for the user. The dimensions of the storage chamber are advantageously between 5×5×5 cm and 100×50×50 cm. Thus, the volume and weight of the enclosure according to the invention present with regard to the user great convenience of transport and storage. This long-term protection casing can advantageously comprise opening/closing means provided in the envelope, for example by hinge and security bolt, so as to be able to easily access the objects and optionally replace them.

The invention is not limited to the example embodiments described and shown above. This is because the shape of the external enclosure 1 and of the insulation with high thermal resistance 2, shown above in parallelepipedal form, may just as well be cylindrical or of revolution. In addition, the method can be implemented by forming a cavity in the mass of insulation with high thermal resistance, for introducing an insulating slip with high thermal resistance containing the objects to be protected thermally, filling in the cavity with the slip and leaving it to dry until the slip solidifies so as to make the slip and mass assembly uniform. Advantageously, the cavity is conformed so as to centre the objects to be protected in the mass.

The external enclosure 1 can consist of another material with high mechanical strength, such as Kevlar or carbon. The thickness of the insulation with high thermal resistance 2 may be substantially higher than 5 mm as described above, in order to protect an element against even higher temperatures, with a view to stricter fire-resistance standards, such as those relating to aircraft. Moreover, the protective casing is not limited to a black box or a storage enclosure but may just as well be used for the thermal protection of any type of casing, such as a case for transporting goods, food or medication or a munitions transport case.

The invention claimed is:

1. A protective casing comprising an insulating block with high thermal resistance based on gypsum crystals, mainly including crystals of hydrated calcium sulphate of type α, an enclosure with high mechanical resistance to crushing that adopts the external shape of the block of thermal insulation, and a watertight silicone-based pouch encapsulating the objects to be protected, the pouch being placed substantially isotropically within the insulation with high thermal resistance.

2. A protective casing according to claim 1, in which the material of the enclosure is chosen from a material based on metal, Kevlar and carbon fibres.

3. A protective casing according to claim 1, wherein the enclosure comprises steam discharge openings.

4. A protective casing according to claim 1, wherein it is conformed according to the dimensions of a data-recording black box.

5. A protective casing defining the black box according to claim 4, wherein the objects to be protected include a storage memory and a signal converter, installed on an electronic card.

6. A protective casing defining the black box according to claim 5, wherein the external enclosure and the pouch are provided with at least one sealed conduit for electrical wires to pass.

7. A protective casing according to claim 1, wherein it is conformed according to the dimensions of a box for the long-term storage of precious objects to be protected.

8. A method of protecting at least one object, the method comprising embedding, without trapping air, the at least one object in a mass of insulation with high thermal resistance based on gypsum crystals, casting this mass of insulation in a structure with high mechanical resistance to crushing, and producing in advance protection against immersion of the objects by watertight encapsulation of the at least one object to be protected.

9. A protection method according to claim 8, in which the structure effects a discharge of gases when exposed to high temperatures.

10. A protection method according to claim 8, further comprising weighting the composition of the insulation by a distribution between a quantity of crystals of hydrated calcium sulphate of type α and a quantity of crystals of hydrated calcium sulphate of type β, in accordance with the thickness of the insulation required and the maximum temperature that can be withstood by the objects to be protected.

11. A protection method according to claim 8, wherein the insulation with high thermal resistance is mainly composed of crystals of hydrated calcium sulphate of type α.

12. A protection method according to claim 8, wherein the insulation with high thermal resistance also contains at least one of: binders and additives.

13. A protection method according to claim 8, wherein the insulation with high thermal resistance also incorporates an inert mineral filler.

14. A protection method according to claim 8, further comprising filling, by an insulating slip with high thermal resistance, an enclosure serving as a structure with high mechanical strength in which the objects to be protected are placed, previously encapsulated in a watertight pouch and introduced into the enclosure through an orifice, and then closing off the filling orifice of the enclosure once the slip has solidified.

15. A protection method according to claim 8, further comprising filling, by an insulating slip with high thermal resistance, a temporary mould serving as the structure and in which there are placed the objects to be protected previously encapsulated in a watertight pouch, and then removing the temporary mould after solidification of the slip into an insulating block with high thermal resistance, and placing an enclosure formed by at least two parts in place of the mould in order to adopt the shape of the insulating block.

16. A protection method according to claim 8, wherein the objects to be protected are placed substantially at the center of the insulation with high thermal resistance, so that the thermal protection of the objects is isotropic.

* * * * *